United States Patent
Tsai et al.

(10) Patent No.: US 6,594,772 B1
(45) Date of Patent: Jul. 15, 2003

(54) CLOCK DISTRIBUTION CIRCUITRY TO DIFFERENT NODES ON INTEGRATED CIRCUIT WITH CLOCK COUPLING CIRCUITRY TO MAINTAIN PREDETERMINED PHASE RELATION BETWEEN OUTPUT AND INPUT OF ADJACENT NODES

(75) Inventors: Li C Tsai, Ft Collins, CO (US); Daniel Krueger, Ft Collins, CO (US); Johnny Q Zhang, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/483,283

(22) Filed: Jan. 14, 2000

(51) Int. Cl.[7] .................................................. G06F 1/04
(52) U.S. Cl. ....................... 713/500; 713/400; 713/401; 713/500; 713/501; 713/502; 713/503
(58) Field of Search ................................ 713/500–503, 713/400–401

(56) References Cited

U.S. PATENT DOCUMENTS

| | | | | | |
|---|---|---|---|---|---|
| 5,043,596 A | * | 8/1991 | Masuda et al. | ............. | 307/262 |
| 5,278,457 A | * | 1/1994 | Fujita et al. | ................. | 307/269 |
| 5,317,601 A | * | 5/1994 | Riordan et al. | ............. | 375/107 |
| 5,463,337 A | * | 10/1995 | Leonowich | ................. | 327/158 |
| 5,506,982 A | * | 4/1996 | Hotta et al. | ................. | 395/550 |
| 5,815,016 A | * | 9/1998 | Erickson | ..................... | 327/158 |
| 5,963,069 A | * | 10/1999 | Jefferson et al. | ............. | 327/158 |
| 6,111,448 A | * | 8/2000 | Shibayama | .................. | 327/293 |
| 6,396,323 B1 | * | 5/2002 | Mizuno | ....................... | 327/295 |
| 2002/0003452 A1 | * | 1/2002 | Mizuno et al. | ................. | 331/2 |
| 2002/0105367 A1 | * | 8/2002 | Mizuno | ....................... | 327/295 |

* cited by examiner

Primary Examiner—Thomas Lee
Assistant Examiner—Nitin C. Patel (57) ABSTRACT

Integrated circuit clock circuitry includes several clock nodes at different locations on a chip. Each node includes a clock wave input, a clock wave output and feedback circuitry for maintaining a predetermined phase relation between clock waves at the clock wave inputs and outputs. The clock wave input of one of the nodes is directly responsive to a clock wave of a clock wave source. A clock coupling circuit connected between each of the clock wave inputs (except the clock wave input of the node directly responsive to the clock wave source) and each of the clock wave outputs couples clock waves from the clock wave output of a first node to a clock wave input of a second node. Each of the coupling circuits includes feedback circuitry for maintaining a predetermined phase relation between clock waves the first node supplies to the coupling circuit and derived by the coupling circuit. A measure of clock wave skew of the integrated circuit chip is obtained by connecting a clock coupling circuit and a separate node in a path extending between the most distant nodes on the chip. The path includes a phase detector responsive to clock waves supplied to the distantly spaced node and the node of the path extending between the most distant nodes on the chip.

41 Claims, 5 Drawing Sheets

CLOCK DISTRIBUTION CIRCUITRY TO DIFFERENT NODES ON INTEGRATED CIRCUIT WITH CLOCK COUPLING CIRCUITRY TO MAINTAIN PREDETERMINED PHASE RELATION BETWEEN OUTPUT AND INPUT OF ADJACENT NODES

FIELD OF INVENTION

The present invention relates generally to integrated clock circuitry and more particularly to integrated clock circuitry including phase control circuitry in a clock circuit distribution node and/or circuitry connecting the distribution nodes.

BACKGROUND ART

As the size and clock frequencies of integrated circuit chips increase, the need to avoid clock skew becomes greater. Integrated circuit chips currently being designed have areas of approximately $4^8$ square micrometers, defined by a square geometry having 20,000 micrometers (i.e., 2 centimeters) on each side. Clock frequencies of such chips frequently exceed 500 megahertz, with the expectation of clock frequencies in the gigahertz range. In addition, power supply voltages for such chips are typically in the range of about 1.3 volts.

These parameters, in combination with integrated circuit processing variations, temperature variations as a function of time and space (i.e., location of circuits on the chip), and voltage variations as a function of time and space result in considerable problems in maintaining synchronization between leading and trailing edges of clock waves distributed to the thousands of components on an integrated circuit chip. The tendency for the leading and trailing edges of the clock waves distributed to different portions of the integrated circuit as a result of the processing, voltage and temperature variations is generally known in the art as skew.

Figure 1:
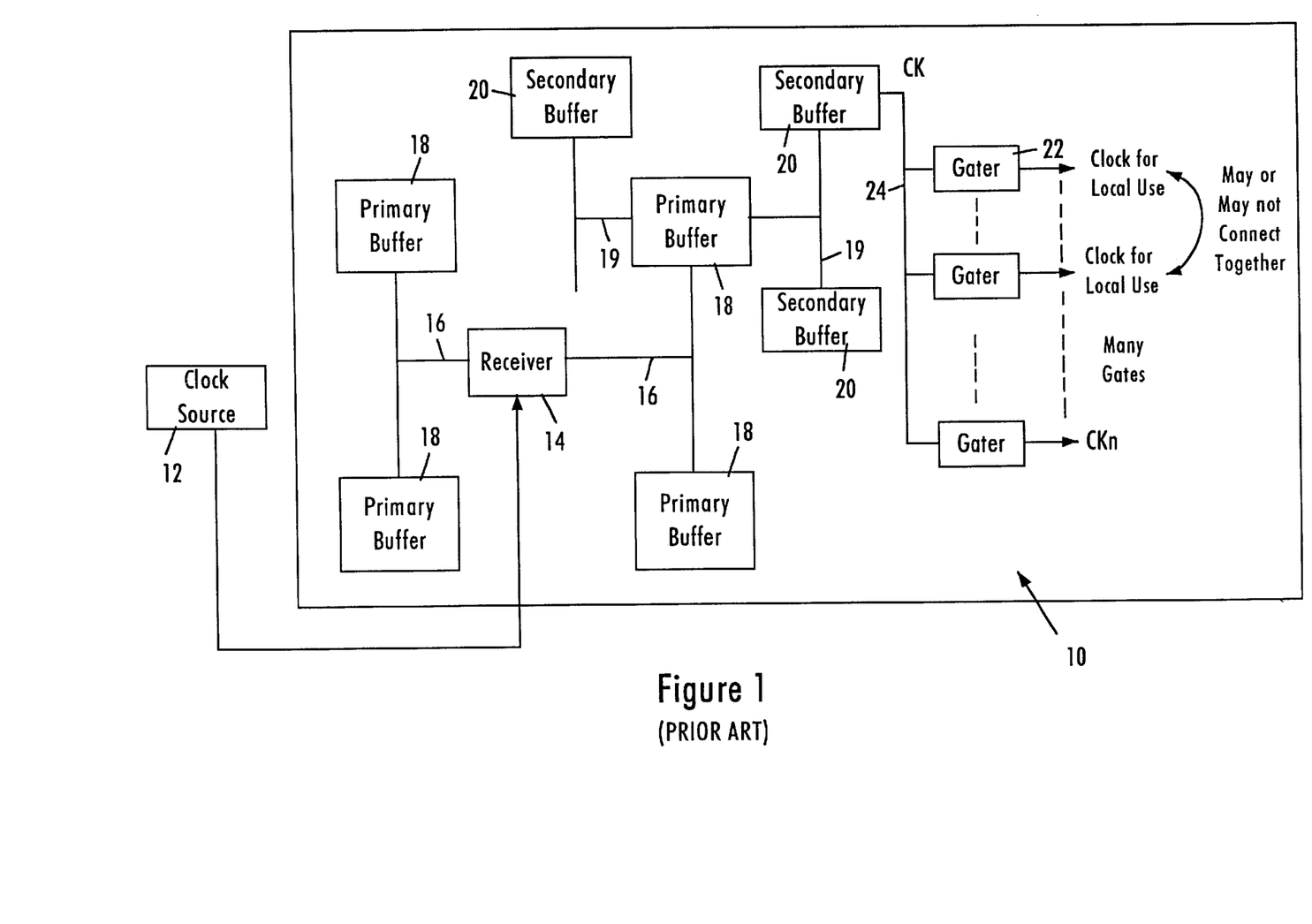
FIG. 1 is a block diagram of a prior art integrated circuit open loop balanced clock distribution network.

FIG. 1 is a block diagram of a prior art circuit for distributing clock waves (i.e., clock pulse trains) to various parts of an integrated circuit. The circuit of FIG. 1 is generally referred to as a balanced clock tree distribution circuit. The circuit of FIG. 1 has certain deficiencies when used in integrated circuits having the previously defined parameters.

The balanced clock tree distribution circuit of FIG. 1 is essentially an open loop arrangement, all of which is carried on a single integrated circuit chip 10. The clock circuitry of FIG. 1 is driven by bi-level clock source 12 which may be on or external to integrated circuit chip 10 and is connected via suitable terminals and wires (i.e., leads) on the chip to receiver 14. Receiver 14 is generally centrally located on chip 10 and includes plural wires 16 connected to primary buffers 18, spatially distributed about chip 10. Each of primary buffers 18 is connected to plural secondary buffers 20; for convenience, the connections of only one of primary buffers 18 to three secondary buffers 20 are illustrated in FIG. 1. Primary buffers 18 respond to clock waves from receiver 14 to supply clock waves via wires 19 to secondary buffers 20. Secondary buffers 20 respond to the clock waves supplied to them by primary buffers 18 to derive clock waves that wires 24 supply to gater circuits 22. Each gater circuit 22 (not shown in detail) is a clock controlled logic circuit also responsive to sources of binary data (i.e., intelligence representing signals). Gater circuits 22 respond to the clock waves supplied to them by secondary buffers 20 and one or more data signals to produce output signals representing a Boolean logic relation between the clock wave and data signal(s) supplied to the gater. Gater circuits 22 control coupling of the binary intelligence representing signals to further logic circuits on chip 10. Frequently, receiver 14, as well as buffers 18 and 20, include internal feedback circuitry in the form of a phase lock loop for maintaining a predetermined delay time between the clock wave inputs and outputs of these elements; usually, the phase lock loop of each receiver and buffer causes the clock wave input and output of each receiver and each buffer to have simultaneously occurring leading edges and simultaneously occurring trailing edges.

There are several disadvantages with the integrated circuit clock circuitry illustrated in FIG. 1. The clock waves undergo significant routing delay while propagating between the input of receiver 14 and the output of gater circuits 22. The routing delay can exceed the period of one cycle of the clock waves. As a result, the leading edges of the clock waves the different buffers and gaters derive occur at different times, as do the trailing edges of the clock wave.

The circuit of FIG. 1 is also subject to considerable clock skew. Clock skew arises as a result of variations in component values as a function of integrated circuit processing at different parts of the chip. The processing variations cause differential delays of the clock waves at spatially disparate regions of the integrated circuit. In addition, variations in chip temperature and power supply voltage as a function of time and chip location result in significant differential delays in the clock wave leading and trailing edges as a function of time and chip location. For very high clock frequencies e.g., 1 GHz, different circuits on different parts of the chip dissipate considerably different amounts of power as a function of operations performed by the circuits. Transient temperature variations as great as 10° C. have been observed. Such variations have a considerable impact on clock wave propagation times. A further problem with the circuit of FIG. 1 is that there are only two phases, displaced from each other by 180°, available for clock synchronization purposes. In many situations, it is desirable for clock waves to be derived at several (i.e., three or more) phases of a clock source.

It is, accordingly, an object of the present invention to provide new and improved integrated circuit clock distribution circuitry, wherein clock waves derived at disparate locations on an integrated circuit chip have substantially the same phase, or have predictable, stable phase differences.

Another object of the present invention is to provide a new and improved integrated circuit clock distribution circuit, particularly adapted for use on relatively large integrated circuits operating at high clock frequencies, wherein effects of semiconductor processing, as well as temperature and voltage variations as a function of time and/or space are minimized.

Another object of the invention is to provide a new and improved integrated circuit clock distribution circuit, wherein clock waves having several phases, closely synchronized with each other, are derived at substantially the same location on an integrated circuit chip.

An additional object of the present invention is to provide new and improved integrated circuit clock distribution circuitry wherein the lengths of the wires between phase detecting circuitry and delay elements controlled thereby are minimized.

SUMMARY OF THE INVENTION

In accordance with one aspect of the present invention, clock circuitry for supplying clock waves to many loads on an integrated circuit chip includes several clock node circuits at different locations on the chip and clock coupling circuitry connected between a clock wave output and input of adjacent clock nodes. Each clock node circuit and the clock coupling circuitry are arranged for maintaining a predetermined phase relation between the clock wave output and input of adjacent clock nodes. The clock node circuits and the clock coupling circuits include a feedback arrangement for maintaining the predetermined phase relation. The clock wave inputs and outputs of the nodes are connected so there is no direct feedback from the clock wave outputs and inputs of any of the different clock nodes.

A feature of the invention is the inclusion of circuitry connected to be responsive to the clock waves at spatially displaced first and second nodes on the chip for (a) comparing the relative phases of the clock waves at the spatially displaced nodes, and (b) deriving a signal indicative of clock skew quality of the chip clock circuitry.

Preferably the signal-deriving circuitry includes: (a) an additional clock node, (b) an additional coupling circuit responsive to a clock wave at the first node, and (c) a phase detector arrangement. The additional clock node responds to a clock wave derived from the additional coupling circuit. The phase detector arrangement responds to a clock wave at the second node and the clock wave output of the additional node to derive the clock skew quality signal.

Another aspect of the invention relates to clock circuitry for supplying clock waves to many loads on an integrated circuit chip, wherein the clock circuitry includes several clock nodes at different locations on the chip and clock coupling circuitry connected between adjacent clock nodes. Each clock node includes (a) a clock wave input, (b) a clock wave output and (c) feedback circuitry for maintaining a predetermined phase relation between clock waves at the clock wave input and clock wave output of the particular node. The clock coupling circuitry maintains a predetermined phase relation between the output and input of the adjacent clock nodes.

Preferably the feedback circuitry of each node includes a phase detector responsive to clock waves having differing phases within the particular node, and a phase controller (i.e., delay elements in one particular embodiment) responsive to the phase detector of the particular node for controlling the relative phases of the clock waves at the clock wave input and the clock wave output of the particular node. The feedback circuitry of each node has a nominal delay of at least one cycle of the clock wave. The phase detector of each node responds to first and second clock waves having a relative nominal phase of N times one cycle of the clock wave, where N is an integer including one.

In the preferred embodiment, the phase controller of each node includes first and second phase controllers responsive to the phase detector of the node. The first phase controller controls the relative phase delay of a first path in the particular node for coupling the clock waves from the clock input to the clock output of the particular node. The second phase controller controls the relative phase delay of a second path in the particular node for coupling the clock waves from the clock output to the clock input of the particular node.

Each coupling circuit preferably includes a feedback loop having a first path for supplying clock waves from the clock output of the first node to the clock input of the second node and a second path for supplying clock waves from the clock input of the second node to a spatial location on the chip in much closer proximity to the output of the first node than any portion of the second node. The first and second paths have the same delay times causing the clock waves at the output of the first node and at the spatial location to be phase displaced from each other by P×360°/2, where P is an integer including one. A phase detector responsive to the relative phases of the clock waves at the output of the first node and at the end of second path controls the amount of phase delay of the first and second paths of the particular coupling circuit.

A further aspect of the invention concerns clock circuitry for supplying clock waves to many loads on an integrated circuit chip. The clock circuitry comprises several clock nodes at different locations on the chip and clock coupling circuitry connected between a clock wave output and input of adjacent clock nodes. Each clock node includes an arrangement for maintaining a predetermined phase relation between clock waves at the clock wave input and clock wave output of the particular node. Each clock coupling circuit includes a feedback loop for maintaining a predetermined phase relation between the clock wave output of a first of the adjacent nodes and the clock wave input of a second of the adjacent nodes.

In still another aspect of the invention, circuitry responsive to the clock waves at spatially displaced clock nodes on the chip (a) compares the relative phases of the clock waves at the spatially displaced nodes, and (b) derives a signal indicative of clock skew quality of the chip clock circuitry.

The above and still further objects, features and advantages of the present invention will become apparent upon consideration of the following detailed description of specific embodiments thereof, especially when taken in conjunction with the accompanying drawings.

BRIEF DESCRIPTION OF DRAWING

As previously described.

DETAILED DESCRIPTION OF THE DRAWING

Figure 2:
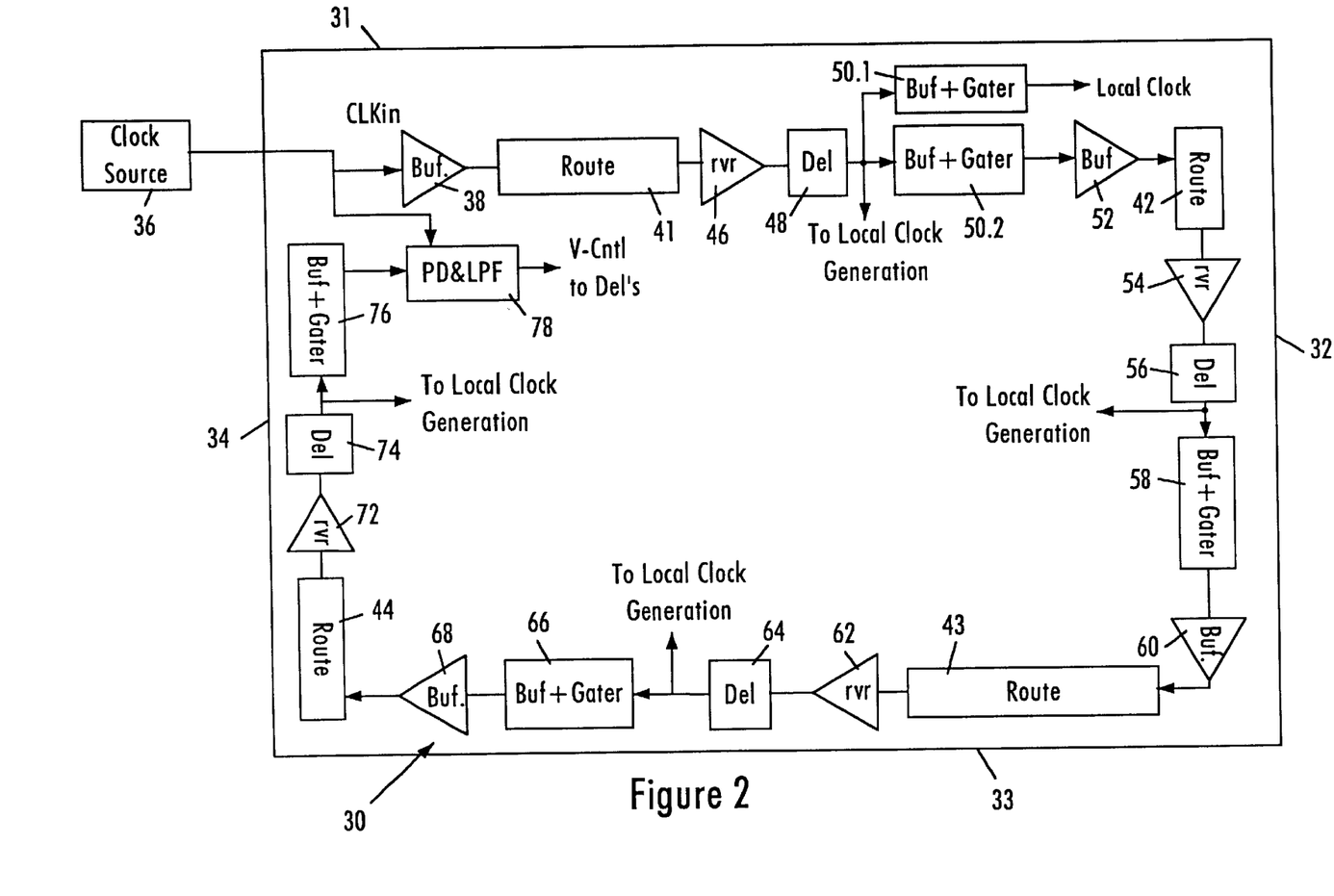
FIG. 2 is a block diagram of an integrated circuit closed loop clock distribution network in accordance with one embodiment of the invention.

FIG. 2 includes integrated circuit chip 30 containing clock coupling and controlling circuitry driven by clock source 36. (The circuitry is illustrated schematically in the figures, which are not drawn to scale.) Clock source 36 supplies a clock wave to buffer 38, located in one region of circuit chip 30. Buffer 38 responds to the wave train from clock source 36 to supply clock waves to various regions of chip 30. For purposes of this description, assume that buffer 38 distributes the clock wave to the integrated circuits on chip 30 at each of the corners of the chip. Consequently, chip 30 is illustrated as including four routes 41–44, each of which is a single integrated circuit wire. Each is respectively illustrated as extending generally parallel to chip sides 31–34. It is to be understood, however, that an actual integrated circuit chip including the features of FIG. 2 has several routes; the routes can extend generally parallel to each of the chip edges but this is not necessary. The wire in each of routes 41–44 in the assumed situation of FIG. 2 has a length that is slightly shorter than the length of each of the corresponding edges. Routes 41–44 are arranged so they extend completely around chip 30 and couple clock waves to different spatial regions of the chip.

The clock wave that buffer 38 supplies to route 41 is recovered by receiver 46, after having propagated through route 41. Receiver 46 reshapes and amplifies the clock wave and supplies it to a voltage-controlled delay element 48. In the exemplary four route situation illustrated in FIG. 2, delay element 48 has a nominal delay time such that there is approximately 90° phase shift between the clock wave supplied by source 36 to buffer 38, the output of delay element 48, and the buffer and gater circuits 50, i.e., a nominal 90° phase exists between the input of buffer 38 and the input of buffer 52 for the clock wave source 36 derives; the phases between the inputs of buffers 38 and 52 can also be nominally displaced by any integral multiple of 90°.

Delay element 48 drives one or more cascaded buffer and gater circuits, illustrated in FIG. 2 as circuits 50.1, 50.2, which are connected to be responsive to the clock waves derived from delay element 48. Each of buffer and gater circuits 50.1, 50.2 drives one or more logic circuits on chip 30. The gate in buffer and gater circuit 50.2 is always open so the clock wave buffer and gater circuit 50.2 derives drives local circuits and/or drives buffer 52. Circuit 50.2 can also be connected to drive local circuits on chip 30, i.e., circuits close to circuit 50.2. There are a sufficiently large number of buffer and gater circuits similar to circuit 50.1 connected to the output terminals of delay element 48 to meet the local clock needs. The gates in the buffer and gater circuit 50.1 and the other buffer and gater circuits similar to circuit 50.1 are selectively opened and closed as required for the operation of the various circuits these buffer and gater circuits drive. Buffer and gater circuit 50.2 assures synchronism between the clock wave that drives buffer 52 and the clock waves responsive to circuit 50.1 and the circuits similar to circuit 50.1. One clock wave propagates through buffer and gater circuits 50.2 to buffer 52, which in turn drives the wire in route 42. The clock wave in route 42 drives receiver 54, which in turn drives voltage-controlled delay element 56. Delay element 56 drives a plurality of buffer and gater circuits 58, having one output which drives buffer 60. To simplify the drawing, the plurality of buffer and gate circuits 58 are shown as a single element, but it is to be understood that circuits 58 are configured similar to circuits 50.1 and 50.2.

The circuitry coupled with routes 42–44 is essentially the same as the circuitry coupled to route 41. Hence, the circuitry coupled to each of routes 41–44 includes a receiver, voltage-controlled delay element, one or more buffer and gater circuits driven by an associated voltage-controlled delay element, and an output or driver buffer. The output of buffer 68 drives a single wire constituting a passive route. Typically, several buffer and gater circuits are associated with each route and operate as discussed supra in connection with buffer 50.1. The clock wave outputs of routes 41–43 are respectively coupled to clock wave inputs of routes 42–44 so routes 41–44 are cascaded with each other. From the foregoing, the buffers (e.g., buffer 38), routes (e.g., route 41), receivers (e.g., receiver 46) and the buffer and gater circuits which drive a buffer (e.g., buffer and gater circuits 50.2) are clock coupling circuits. Delay elements are also part of the clock coupling circuitry; in addition, delay elements are part of clock control circuitry, as will become evident.

Control of the delay introduced by the delay elements (e.g., delay element 48) associated with each of routes 41–44 is provided by a DC voltage and derived by phase detector and low pass filter circuit 78. Phase detector and low pass filter circuit 78 responds to the phase difference of the clock waves derived by route 44 and applied to route 41 to derive a DC voltage. The DC voltage has an amplitude and polarity indicative of the phase difference and is applied in parallel to delay elements 48, 56, 64 and 74, respectively associated with routes 41, 42, 43 and 44.

To these ends, the clock wave derived at the output terminals of route 44 is coupled to receiver 72, delay element 74 and buffer and gater circuits 76. The outputs of buffer and gater circuits 76 are connected to one input of phase detector and low pass filter circuit 78, physically located at the region of integrated circuit chip 30 close to buffer 38. Phase detector and low pass filter circuit 78 is also responsive to the clock wave output of clock source 36 and is in close spatial proximity to buffer 38; e.g., phase detector and low pass filter circuit 78 and buffer 38 are spaced very close to each other. Phase detector and low pass filter circuit 78 responds to the edges of the two clock wave inputs thereof to determine the phase displacement of the clock waves, to derive a DC voltage having a magnitude indicative of the phase displacement of the clock input to buffer 38 and the clock output of buffer and gater circuit 76. Phase detector and low pass filter 78 derives a DC voltage that is applied in parallel as a control voltage to each of delay elements 48, 54, 64 and 74.

The delay time of the circuitry associated with each of routes 41–44 is such that the total phase delay between the clock wave supplied to the input of buffer 39 and the clock wave derived by buffer and gater circuits 76 is N times the period of one cycle of the clock frequency, where N is an integer including one. The delay time of the circuitry associated with each of routes 41–44 is approximately the same so that, for example, the delay time of the circuitry associated with buffer 38, route 41, receiver 46, delay element 48 and buffer and gater circuits 50 is the same as the delay time as buffer 52, route 42, receiver 54, delay element 56 and buffer and gater circuits 58.

Circuit elements 38–76 (except buffer and gater 50.1) can be considered as a clock wave path having a first terminal, at the input terminal of buffer 38, one or more intermediate terminals, e.g., at the input terminals of buffers 52, 60 and 68, and a second terminal at the output of buffer and gater 76.

The circuit of FIG. 2 is generally satisfactory for small chips. If, however, chip 30 has a large area, e.g., 20,000 micron long edges, certain problems exist with the closed loop clock distribution circuitry of FIG. 2. In such a case the clock waves at different locations on integrated circuit chip 30 are likely not to be exactly synchronized. This is because of skew due to voltage and temperature variations as a function of time and space, as well as processing variations of circuit elements on different parts of such a large chip. There are differential delays of the clock waves in propagating about the clock circuitry illustrated in FIG. 2 at different times during chip operation. At the different spatial locations on the chip, there are variations in temperature and voltage relative to other locations on the chip. In addition, depending upon the nominal delay time of each of delay elements 48, 56, 64 and 74, there can be as much as a 90° phase displacement of the clock waves at different spatial regions of a large chip. For example, if the nominal delay of each of delay elements 48, 56, 64 and 74 is 90°, clock waves derived from buffer and gater circuit 50.1 are 90° phase displaced from the clock waves derived from the buffer and gater circuits delay element 56 drives. Extra circuits are needed to recover 0° degree clock. If the circuits driven by the clock outputs of buffer and gater circuits 50.1 interact with the circuits driven by the clock outputs derived by the buffer and gater circuit delay element 56 drives, some provision must be made to account for these phase displacements.

If chip 30 is large, a further disadvantage of the clock circuitry illustrated in FIG. 2 is that the DC control voltage derived from phase detector and low pass filter circuit 78 must be routed to delay elements 48, 54, 64 and 74 on spatially disparate parts of integrated circuit chip 30. Because of noise on wires of integrated chip 30 connecting phase detector and low pass filter circuit 78 to each of delay elements 48, 54, 64 and 74, there is a substantial likelihood of the output voltage of circuit 78 changing appreciably between the output of the phase detector and low pass filter circuit and the input of different ones of the voltage controlled delay elements. Consequently, the delay times established by the different delay elements are likely to change as a function of the spatial relationship of the delay elements relative to the output terminal of the phase detector and low pass filter.

Figure 3:
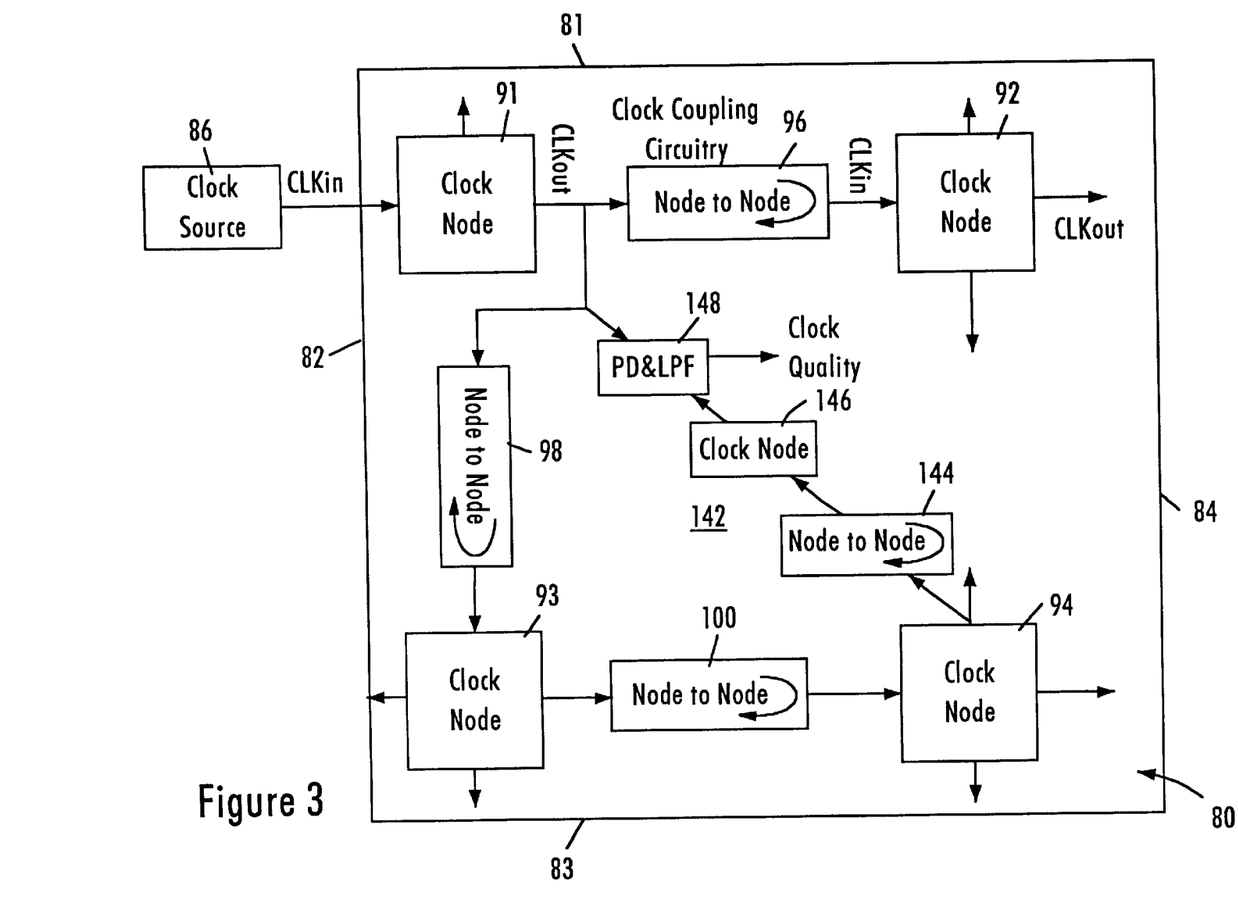
FIG. 3 is a block diagram of a clock distribution network in accordance with a preferred embodiment of the present invention, in combination with circuitry for deriving a measure of clock skew quality.

Reference is now made to FIG. 3 of the drawing, wherein a hybrid clock distribution network is illustrated as being included on integrated circuit chip 80, including sides 81–84 which are at right angles to each other. In a typical 0.18 micron technology chip, each of sides or edges 81–84 has a length of as much as 20,000 micrometers and the clock distribution circuitry extends generally parallel to and in close proximity to edges 81–83. The hybrid clock distribution network on integrated circuit chip 80 is driven by clock source 86, connected to the clock distribution circuitry by suitable terminals (not shown) on the chip.

The clock distribution network on chip 80 is referred to as a hybrid clock distribution network because it has certain closed loop and open loop characteristics. As such, the clock distribution loop includes some of the open circuit aspects of the prior art of FIG. 1, and other closed loop attributes similar to the feedback circuitry of FIG. 2.

In the distribution network of FIG. 3, there is phase detection feedback circuitry at each clock distribution (i.e., clock node) location and in each route connecting adjacent clock nodes together. However, there is no overall phase detection, as in the distribution network of FIG. 2. Instead, control of each clock distribution node and each route is independent of the other nodes and routes.

Figure 4:
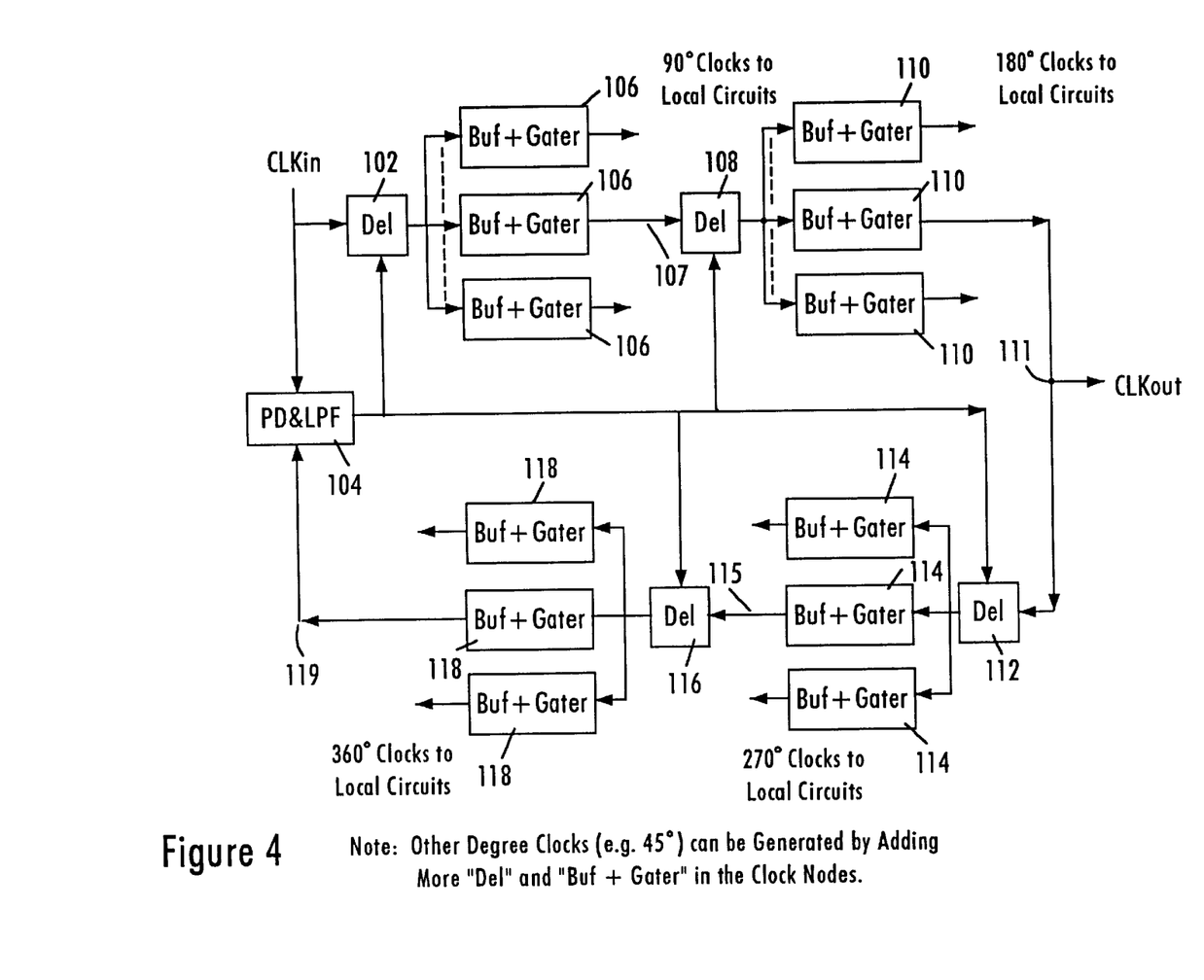
FIG. 4 is a block diagram of circuitry at one clock node included in the circuitry illustrated in FIG. 3.

The hybrid clock distribution network of FIG. 3 is illustrated as including clock nodes 91–94, one of which is located in proximity to each of the corners of integrated circuit chip 80. An actual integrated circuit usually includes many (e.g., 50) clock nodes. Each of clock nodes 91–94 occupies an area of integrated circuit chip 80; in one actual 0.18 micron technology chip having an area of about 4cm², the area is about 400 hundred square microns. Details of the circuitry included in each of clock nodes 91–94 are illustrated in FIG. 4.

Figure 5:
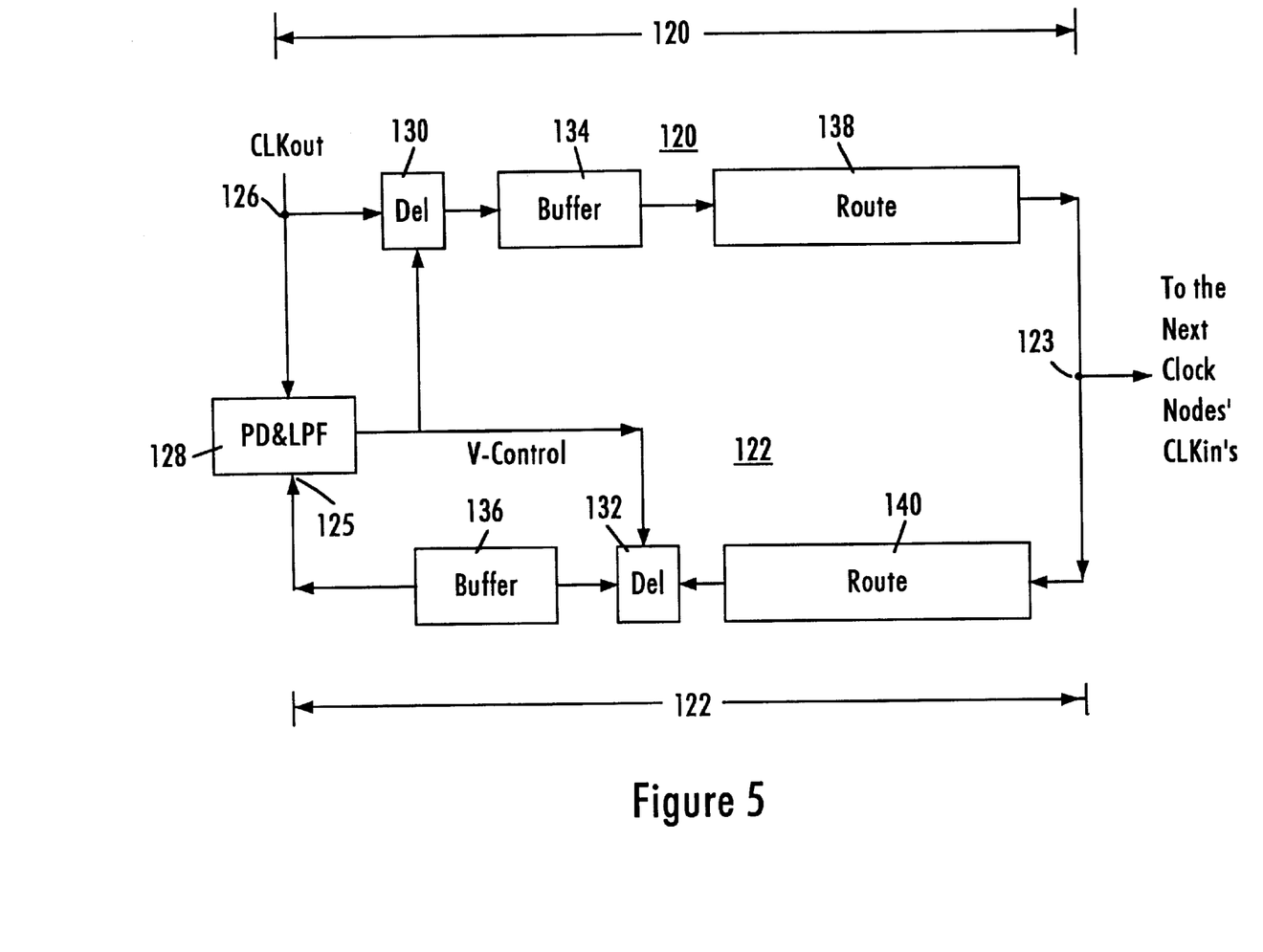
FIG. 5 is a block diagram of circuitry included in a node-to-node coupling circuit of FIG. 3.

The clock nodes at the different corners of chip 80 are interconnected to each other by node-to-node coupling circuits 96, 98 and 100, illustrated in detail in FIG. 5. Node-to-node coupling circuits 96, 98 and 100 are respectively illustrated for purposes of example in FIG. 3 as extending generally parallel to and in close proximity to sides 81, 82 and 83, but the layout thereof is not so limited. Node-to-node coupling circuits 96, 98 and 100 are arranged such that the clock output of node 91 is supplied to coupling circuit 96, which drives clock node distribution circuit 92 that is adjacent to node 91. Clock node 91 also drives node-to-node coupling circuit 98, which in turn drives clock node 93, also adjacent node 91. Node-to-node coupling circuit 100 responds to a clock output of clock node 93, to supply a clock wave to clock node 94 that is adjacent clock node 93. Clock node 91 supplies coupling circuits 96 and 98 with clock waves having virtually the same phase as the clock wave that source 86 supplies to the input of node 91.

As a result of feedback circuitry in each of node-to-node coupling circuits 96, 98 and 100, the clock waves derived by the node-to-node coupling circuits have substantially the same phase as the clock waves supplied to these coupling circuits. Feedback circuitry in clock nodes 91–94 assures that the clock outputs these clock nodes supply to coupling circuits 96, 98 and 100 or to other circuits on chip 80 are in phase with the clock inputs of these nodes or are displaced by precisely controlled predetermined phase angles from the clock inputs of the clock nodes.

Because of the localized feedback at each of clock nodes 91–94 and the localized feedback in each of node-to-node coupling circuits 96, 98 and 100, as well as because of the passive nature and position of the vast majority of circuits in the node-to-node coupling circuitry, the arrangement of FIG. 3 is able to avoid clock skew even if there are substantial power dissipation, temperature and voltage differences as a function of time and space on the chip, and processing variations on a single chip or on different chips. These results can be achieved, inter alia, because (1) the circuitry in each clock node and each node-to-node coupling circuit is separately controlled to precisely and separately control the timing of the clock waves each node supplies to its various loads and (2) the wires of the passive node-to-node coupling circuits have lower mismatch than active circuits. The wires extend over relatively large distances while the active elements occupy small areas of only several 100 square microns. All of these factors make the circuit of FIG. 3 feasible for large chips, as described supra. In contrast, if the clock distribution network of FIG. 2 were to be used on a large chip, such as a chip with 20,000 micron long edges, there would be a mismatch over the entire clock distribution network because all elements in the network are interconnected by the network feedback loop.

The clock distribution network of FIG. 3 has the further advantage of closed loop clock distribution from one clock node to another. Because of the localized feedback at each clock node and each node-to-node coupling circuit, the clock distribution network of FIG. 3 has compensation for process variations, as well as voltage and temperature variations that occur as a function of time and space.

While only four clock nodes and three node-to-node coupling circuits are illustrated in FIG. 3, for simplicity, in most instances there are many more than four clock nodes and the clock nodes are not necessarily located in proximity to the chip corners but are likely located at different regions of integrated circuit chip 80.

A block diagram of the circuitry included at each of clock nodes 91–94 is illustrated in FIG. 4. The clock wave supplied to a particular clock node is applied in parallel to voltage controlled delay element 102 and one input of phase detector and low pass filter circuit 104. A second input of phase detector and low pass filter 104 is a clock pulse train (i.e., clock wave) that has been phase shifted by N×360° (where N is an integer including one) relative to the clock pulse train supplied to the particular clock node. The phase shift imposed on the second input of phase detector and low pass filter circuit 104 is provided by circuitry in the particular clock node. Phase detector and low pass filter circuit 104 responds to the differential phases of the two inputs thereof to derive a DC control voltage having a magnitude and polarity determined by the phase difference of the two clock waves supplied to the circuit. The two clock input terminals of phase detector and low pass filter 104 are in very close physical proximity to each other, typically being derived from locations on chip 80 that are only a few micrometers away from each other.

Voltage-controlled delay element 102 responds to the DC output voltage of phase detector and low pass filter circuit 104 to control the phase delay (i.e., delay time) of the clock wave supplied to delay element 102. In the embodiment of FIG. 4, the combination of delay element 102 and buffer and gater circuit 106.2 has a nominal delay time of one quarter of the period of one cycle of the clock wave applied to the clock node. The voltage derived from phase detector and low pass filter 104 precisely controls the delay time of delay element 102.

Delay element 102 supplies clock waves in parallel to several buffer and gater circuits 106. Buffer and gater circuits 106 are configured the same as the buffer and gater circuits of FIG. 2. As such, the buffer and gater circuits are responsive to binary information indicating (i.e., data) signals and supply these signals under the control of the clock waves to other circuitry (not shown) on integrated circuit chip 80. A sufficient number of buffer and gater circuits 106 is used to meet local clocking needs.

The clock wave derived by one of buffer and gater circuits 106 drives voltage controlled delay element 108 since the gate thereof is always open. The gates of the remaining buffer and gater circuits 106 are selectively open to drive circuits on chip 80 in the vicinity of these buffer and gater circuits.

Delay element 108 has a control input responsive to the DC output of phase detector and low pass filter circuit 104 so delay elements 102 and 108 introduce the same delay on the clock wave supplied to them. The combination of delay element 108 and buffer and gater circuit 110.2 has a nominal delay equal to a 90° phase shift of one cycle of the frequency of source 86, whereby the output of buffer and gater circuit 110.2 is complementary (i.e., phase shifted 180°) to the clock wave supplied to delay element 102. The output of delay element 108 drives several buffer and gater circuits 110 in parallel. One of buffer and gater circuits 110 drives terminal 111, whereby the clock wave derived at terminal 111 is essentially 180° phase displaced from the clock inputs of delay element 102. The clock wave derived at terminal 111 is supplied to the node-to-node coupling circuit coupled to be directly responsive to the particular clock node. For example, if the circuit of FIG. 4 represents clock node 91, the clock wave at terminal 111 drives node-to-node coupling circuits 96 and 98 (FIG. 3) in parallel.

The clock wave at terminal 111 also drives voltage controlled delay element 112, having a nominal delay commensurate with a 90° phase shift of the clock wave derived by clock source 86. The magnitude and polarity of the output voltage of phase detector and low pass filter circuit 104 control the total delay element 112 imposes on the clock wave at terminal 111. Delay element 112 supplies parallel clock waves to several buffer and gater circuits 114, one of which has an output terminal 115, connected to an input of voltage controlled delay element 116, having a nominal delay of 90°. The total delay of element 116 is controlled by the output voltage of phase detector and low pass filter circuit 104.

Delay element 116 supplies clock waves in parallel to several buffer and gater circuits 118, one of which has an output terminal connected to terminal 119. The clock wave at terminal 119 is phase displaced by 360° or an integral multiple thereof, relative to the phase of the clock wave supplied to the clock node illustrated in FIG. 4. The second input of phase detector and low pass filter circuit 104 responds to the clock wave at terminal 119. Terminal 119 is located in close physical proximity (e.g., a few micrometers) to the location in the particular clock node where the clock pulses were originally supplied to the clock node to assure that the clock waves at the input and output terminals of the particular clock node have a relative phase shift of N×360°, where N is an integer, including one.

From the foregoing, the clock node illustrated in FIG. 4 derives four orthogonally phased clock waves, such that the clock waves derived by buffer and gater circuits 106, 110, 114 and 118 are respectively phase displaced by 90°, 180°, 270° and 360° from the clock waves originally supplied to the clock node. These four mutually orthogonal clock waves are supplied to suitable circuits in close proximity to the particular clock node.

While four voltage-controlled delay elements are specifically illustrated in the clock node of FIG. 4, it is to be understood that a particular clock node can include any number of delay elements, greater than one. If, for example, a particular clock node has two delay elements, each of the delay elements has a phase delay of approximately 180°. In such an instance, the clock wave the particular clock node supplies to its associated node-to-node coupling circuit driven by the clock node is phase displaced by 180° from the clock wave supplied to the particular clock node. Regardless of the number of voltage-controlled delay elements in a specific clock node, the clock wave supplied by a specific clock node to the node-to-node coupling circuit driven by the particular clock node is phase displaced by M×180° (where M is an integer, including one) from the clock input to the particular clock node.

The circuitry included in each of the node-to-node coupling circuits 96, 98 and 100 is illustrated in FIG. 5. Each of node-to-node coupling circuits 96, 98 and 100 responds to a clock wave output of the clock node which drives the node-to-node coupling circuit. In addition, each of node-to-node coupling circuits 96, 98 and 100 supplies a clock wave to a clock node adjacent the clock node which drives the particular node-to-node coupling circuit. Further, each node-to-node coupling circuit supplies a clock wave back at the clock node which originally supplied a clock wave to the node-to-node coupling circuit. The clock wave the node-to-node coupling circuit supplies back at the clock node has leading edges going in the same direction and in substantial time coincidence with the leading edges the clock node supplies to the node-to-node coupling circuit and has trailing edges going in the same direction and in substantial time coincidence with the trailing edges the clock node supplies to the node-to-node coupling circuit. For example, node-to-node coupling circuit 96 responds to the clock pulse train output of clock node 91 to supply a clock pulse train to clock node 92 which is spatially adjacent clock node 91. Node-to-node coupling circuit 96 also supplies a clock wave back at the input end of circuit 96 next to node 91. The clock wave node 91 supplies to coupling circuit 96 is phase displaced by N×180° from the clock wave coupling circuit 96 feeds to clock node 92.

Each of node-to-node coupling circuits 96, 98 and 100 includes a forward path 120 and a feedback path 122. Both paths have the same length and include identical components so the delay times of the forward and feedback paths are the same and equal to an integral multiple of a half cycle (i.e., 180°) of clock source 86. A description of circuit 96 suffices for each of circuits 96, 98 and 100 since all of circuits 96, 98 and 100 are identical and are connected to the nodes associated with them in the same way. Each of paths 120 and 122 imposes a phase shift of P×180° (where P is an integer including one) on the clock wave a particular clock node supplies to it. Input terminal 126 of path 120 is coincident with the output terminal of clock node 91. Forward path 120 has an output terminal 123 connected to and coincident with (1) the clock input of clock node 92 and (2) the input of feedback path 122. Path 122 has an output terminal 125 connected to and coincident with one input terminal of phase detector and low pass filter 128, having a second input terminal connected to terminal 126 of clock node 91.

Hence, the second feedback path 122 in each node-to-node coupling circuit originates at the node connected to the output terminal of path 120 and returns to the location on chip 80 in close proximity to the point where a clock wave was originally supplied to path 120. The phases of the clock waves supplied to the location on the chip where the node-to-node coupling circuit is initially responsive to a clock node output are compared in phase detector and low pass filter 128 which derives a DC control signal for variable, voltage controlled delay elements 130 and 132 of paths 120 and 122, respectively. Delay elements 130, 132, 134, 136 are in close spatial proximity so they have approximately the same temperature, voltage and process variations.

The clock wave clock node 91 derives drives path 120 of node-to-node coupling circuit 96 via terminal 126. The clock wave at terminal 126 flows in parallel to (1) voltage controlled delay element 130, and (2) phase detector and low pass filter circuit 128. Phase detector and low pass filter circuit 128 is also responsive to the clock wave coupled to the output terminal of the second path 122. Phase detector and low pass filter circuit 128 responds to the phase difference of the two clock waves supplied to it to derive a DC control voltage that is applied in parallel to delay elements 130 and 132 of paths 120 and 122. Each of the combinations of (1) delay element 130, buffer 134 and route 138 and (2) delay element 132, buffer 136 and route 140 has a nominal phase shift (i.e., delay time) of P×180°. The amplitude of the DC output of circuit 128 provides fine control of the delay times of elements 130 and 132. Delay elements 130 and 132 respectively apply clock waves to buffers (i.e., drivers) 134 and 136 which shape and amplify the clock waves applied to them. Buffer 134 supplies a shaped and amplified clock wave to a wire formed on integrated circuit chip 80, designated in FIG. 5 as route 138.

For the situation illustrated in FIG. 5, route 138 has a length somewhat less than the length of each of sides 81, 82 and 83 of integrated circuit chip 80. In other situations, route 138 is likely to have a considerably shorter length, equal approximately to a shorter distance (e.g., 5,000 micrometers) between adjacent clock nodes on an integrated circuit chip.

The clock wave propagating to the end of route 138 flows in parallel to input terminal 123 of the adjacent clock node 92 and to a wire forming route 140. The wire of route 140 matches exactly the wire of route 138 because the wires have exactly the same properties, such as length, cross sectional area, shape and crossovers. The clock wave, after propagating through the wire of route 140, flows to voltage controlled delay element 132, which in turn drives buffer 136.

Because of the P×180° phase delay between the clock inputs and outputs of clock node 91 and the 180° phase delay between input 126 and output 123 of the node-to-node coupling circuit 96 along path 120, the clock wave at output terminal 123 of node-to-node coupling circuit 96, as applied to the node 92, is in phase with the clock wave clock source 86 applies to clock node 91. This is true for the clock waves applied to all of clock nodes 91–94, node-to-node coupling circuits 96, 98 and 100 so the clock waves applied to all of the clock nodes are all in phase with each other, or are phase displaced from each other by an integral multiple of 360°.

The circuitry and wires in path 120 are balanced with the circuitry and wires in path 122 so both paths 120 and 122 introduce the same phase delay on the clock waves applied to them. The exact phase delays of paths 120 and 122 are controlled by the nominal delay times of routes 138 and 140 as well as of delay elements 130 and 132 and the fine control for the delay times of delay elements 130 and 132 provided by the DC output voltage of phase detector and low pass filter circuit 128.

The wires of routes 138 and 140 are in close physical proximity to each other on chip 30 and occupy the vast majority of lengths of the paths between clock nodes 91 and 92. In particular, matching wires over a long distance on a chip is much easier to accomplish than matching active circuit elements. In addition, matching active circuit elements over a small area (a few hundred square microns) is much easier than over the area of a large chip (e.g., 20,000 microns on a side). The active elements of the clock circuitry included in chip 80 are the delay elements, the buffer and gater circuits, the phase detector and low pass filter circuits, and the buffers of FIGS. 4 and 5. The passive elements are the wires connecting the active elements, particularly the wires in routes 138 and 140. The active elements in delay elements 130 and 132 as well as buffers 134 and 136, occupy a very small percentage of the lengths of the paths. These properties, which provide a high degree of the previously mentioned matching characteristics associated with low skew, enable the integrated circuit on chip 30 to have low skew.

The circuit of FIG. 3 has very low clock skew because, inter alia, (1) each of clock nodes 91–94 has a localized phase control feedback arrangement, (2) each of node-to-node coupling circuits 96, 98 and 100 has a separate phase control feedback arrangement and (3) matched wires are used in routes 138 and 140 over a long distance, and (4) matching of active elements in delay elements 130, 133, 134 and 136 over long distance is not required.

However, because there is some clock skew, it is desirable immediately after initial fabrication, and sometimes during actual use, to determine the clock skew quality, i.e., the amount of skew in the clock waves derived from the most distant nodes on chip 80.

To these ends, chip 80 includes path 142, connected between clock nodes 91 and 94 that are diagonally opposed to each other on chip 80 so node 94 is spaced father from node 91 than any other node on chip 80. Path 142 includes node-to-node coupling circuit 144, responsive to the output clock wave of clock node 94. The output clock wave of node 94 has a phase displaced by 180°×Q from the phase of the clock wave that node-to-node coupling circuit 100 applies to clock node 94, where Q is an integer. Aside from the lengths of the routes, node-to-node coupling circuit 144 is constructed identically to node-to-node coupling circuits 96, 98 and 100.

The input of node-to-node coupling circuit 144 is in very close proximity to clock node 94. The output of node-to-node coupling circuit 144 is in very close proximity to clock node 146.

Node-to-node coupling circuit 144 supplies the clock wave to clock node 146, spatially located close to clock node 91. Clock node 146 is constructed the same as each of clock nodes 91–94, so the outputs of all of clock nodes 91–94 and 146 are in phase.

Clock node 146 supplies a clock wave to one input of phase detector and low pass filter circuit 148, having a second input responsive to the clock wave derived by clock node 91. Phase detector and low pass filter circuit 148 is spatially located between the output terminals of clock node 146 and clock node 91. Phase detector and low pass filter circuit 148 responds to the phase displacement of the clock waves supplied to it to derive a DC voltage. The magnitude of the DC voltage phase detector and low pass filter circuit 148 derives provides a measure of the amount of clock skew between the most distantly spaced clock nodes 91 and 94 on integrated circuit chip 80. Phase detector and low pass filter 148 supplies via a suitable terminal (not shown) a DC signal to external circuitry connected to integrated circuit chip 80. The DC signal phase detector and low pass filter supplies provides a measure of clock skew quality of the clock circuitry on chip 80.

An alternate arrangement for determining clock skew quality is to eliminate clock node 146 and connect a node-to-node coupling circuit, similar to circuit 144, between the clock wave output terminal of clock node 91 and the input of phase detector and low pass filter 148 which is shown in FIG. 3 as being connected directly to the clock output of clock node 91.

While there have been described and illustrated specific embodiments of the invention, it will be clear that variations in the details of the embodiment specifically illustrated and described may be made without departing from the true spirit and scope of the invention as defined in the appended claims.

We claim:

1. Clock circuitry for supplying clock waves to many loads on an integrated circuit chip, the clock circuitry being on the chip and adapted to be responsive to a source of clock waves, the clock circuitry comprising several clock nodes at different locations on the chip, each clock node including (a) a clock wave input, (b) a clock wave output and (c) feedback circuitry for maintaining a predetermined phase relation between clock waves at the clock wave input and clock wave output of the particular node; the clock wave input of one of the nodes being adapted to be connected to clock waves of the clock wave source, and clock coupling circuitry connected between the clock wave output and clock wave input of adjacent clock nodes, the clock coupling circuitry being arranged to maintain a predetermined phase relation between the output and input of the adjacent clock nodes.

2. The clock circuitry of claim 1, wherein a particular one of the clock coupling circuit is arranged to couple clock waves from the clock wave output of a first node to the clock wave input of a second node, the particular coupling circuit including a feedback loop for maintaining a predetermined phase relation between the clock wave output of the first node and the clock wave input of the second node.

3. The clock circuitry of claim 2, wherein the clock wave output of each of the nodes has an open loop connection except for the feedback circuitry in the node and feedback circuitry of the coupling circuit connected to be responsive to the clock wave output of each particular node.

4. The clock circuitry of claim 3, wherein the feedback circuitry of each of the nodes includes: a phase detector arrangement connected to be responsive to clock waves having differing phases within the particular node and a phase control arrangement connected to be responsive to the phase detector arrangement of the particular node for controlling the relative phases of the clock waves at the clock wave input and the clock wave output of the particular node.

5. The clock circuitry of claim 4, wherein the feedback circuitry of each node has a nominal delay of at least one cycle of the clock wave, the phase detector arrangement of each node being connected to be responsive to first and second clock waves within the node, the first and second clock waves having a relative nominal phase of N times one cycle of the clock wave, where N is an integer including one.

6. The clock circuitry of claim 5, wherein the phase control arrangement of each node includes first and second phase controller arrangements connected to be responsive to the phase detector of the node, the first phase controller arrangement being arranged for controlling the relative phase delay of a first path in the particular node for coupling the clock waves from the clock input to the clock output of the particular node, the second phase controller arrangement being arranged for controlling the relative phase delay of a second path in the particular node for coupling the clock waves from the clock output to the clock input of the particular node.

7. The clock circuitry of claim 6, wherein each of the first and second controller arrangements includes M cascaded delay elements connected to be responsive to the phase detector of the particular node, where M is an integer greater than one.

8. The clock circuitry of claim 7, wherein each delay element of a particular node has a nominal phase delay of $$\frac{N \times 180°}{M}.$$

9. The clock circuitry of claim 8, wherein the Mth delay element of the second phase controller arrangement of each node has an output in closer spatial proximity to the clock wave input of the particular node than the output of any other delay element of the particular node, the phase detector arrangement including a phase detector with first and second inputs in closer spatial proximity to the clock wave input of the particular node and the output of the Mth delay element of the second phase controller of the particular node than to any other clock waves of the particular node.

10. The clock circuitry of claim 2, wherein the feedback loop of each of the coupling circuits includes a first path connected to supply clock waves from the clock output of the first node to the clock input of the second node and a second path connected to supply clock waves from the clock input of the second node to a spatial location in much closer proximity to the output of the first node than any portion of the second node, the first and second paths nominally having the same delay times for causing the clock waves at the output of the first node and at the spatial location to be phase displaced from each other by P×360°, where P is an integer including one, a phase detector for controlling the amount of phase delay of the first and second paths of the particular coupling circuit, the phase detector being connected to be responsive to the relative phases of the clock waves at the output of the first node and at the spatial location in much closer proximity to the output of the first node than any portion of the second node.

11. The clock circuitry of claim 1, wherein the clock wave inputs and outputs of the nodes are connected so there is no feedback between the clock wave inputs and outputs of any of the different nodes.

12. The clock circuitry of claim 1 further including circuitry connected to be responsive to the clock waves at spatially displaced first and second nodes on the chip for (a) comparing the relative phases of the clock waves at the spatially displaced nodes, and (b) deriving a signal indicative of clock skew quality of the chip clock circuitry.

13. The clock circuitry of claim 12, wherein the signal deriving circuitry includes: (a) an additional one of said clock nodes, (b) an additional one of said coupling circuits having a clock wave input terminal connected to be responsive to a clock wave at the first node, and (c) an additional phase detector; the additional one of said clock nodes having a clock input connected to be responsive to a clock wave derived from said one additional coupling circuit of the signal deriving circuit, the phase detector arrangement being connected to be responsive to a clock wave at the second node and the clock wave output of the additional node for deriving the clock skew quality signal.

14. Clock circuitry for supplying clock waves to many loads on an integrated circuit chip, the clock circuitry being on the chip and adapted to be responsive to a source of clock waves, the clock circuitry comprising several clock nodes at different locations on the chip, each clock node including (a) a clock wave input, (b) a clock wave output and (c) an arrangement for maintaining a predetermined phase relation between clock waves at the clock wave input and clock wave output; the clock wave input of one of the nodes being adapted to be connected to clock waves of the clock wave source, and clock coupling circuitry connected between the clock wave output and clock wave input of adjacent clock nodes, each of the clock coupling circuits including a feedback loop for maintaining a predetermined phase relation between the clock wave output of a first of the adjacent nodes and the clock wave input of a second of the adjacent nodes.

15. The clock circuitry of claim 14, wherein the feedback loop of each of the clock coupling circuits includes (a) an input terminal connected to be responsive to the clock wave at the output terminal of the first node, (b) an output terminal connected to supply clock waves to the input terminal of the second node, (c) a first path connected between the input and output terminals of the feedback loop for supplying clock waves from the clock output of the first node to the clock input of the second node, and (d) a second path connected between the input and output terminals of the feedback loop for supplying clock waves from the output terminal of the feedback loop to a spatial location in much closer proximity to the output of the first node than any portion of the second node, the first and second paths nominally having the same delay times for causing the clock waves at the output of the first node and at the spatial location to be phase displaced from each other by P×360°, where P is an integer including one, a phase detector for controlling the amount of phase delay of the first and second paths of the particular separate circuit, the phase detector being connected to be responsive to the relative phases of the clock waves at the output of the first node and at the spatial location in much closer proximity to the output of the first node than any portion of the second node.

16. The clock circuitry of claim 15, wherein the clock wave inputs and outputs of the nodes are connected so there is no feedback between the clock wave inputs and outputs of any of the different nodes.

17. The clock circuitry of claim 14, wherein the clock wave inputs and outputs of the nodes are connected so there is no feedback between the clock wave inputs and outputs of any of the different nodes.

18. The clock circuitry of claim 14, further including circuitry connected to be responsive to the clock waves at spatially displaced first and second nodes on the chip for (a) comparing the relative phases of the clock waves at the spatially displaced nodes, and (b) deriving a signal indicative of clock skew quality of the chip clock circuitry.

19. The clock circuitry of claim 18, wherein the signal deriving circuitry includes: (a) an additional one of said clock nodes, (b) an additional one of said coupling circuits having a clock wave input terminal connected to be responsive to a clock wave at the first node, and (c) an additional phase detector; the additional one of said clock nodes having a clock input connected to be responsive to a clock wave derived from said one additional coupling circuit of the signal deriving circuit, the phase detector arrangement being connected to be responsive to a clock wave at the second node and the clock wave output of the additional node for deriving the clock skew quality signal.

20. Clock circuitry for supplying clock waves to many loads on an integrated circuit chip, the clock circuitry being on the chip and adapted to be responsive to a source of clock waves, the clock circuitry comprising several clock node circuits at different locations on the chip, each clock node circuit including (a) a clock wave input, (b) a clock wave output and (c) an arrangement for maintaining a predetermined phase relation between clock waves at the clock/wave input and clock wave output; the clock wave input of one of the nodes being adapted to be connected to be responsive clock waves of the clock wave source, and clock coupling circuitry connected between the clock wave output and input of adjacent clock nodes, the clock coupling circuitry being arranged for maintaining a predetermined phase relation between the clock wave output and input of adjacent clock nodes, at least one of (a) said clock node circuits and (b) said clock coupling circuits having a structure including a feedback arrangement, each of the feedback arrangements being arranged for controlling the relative phases of clock waves supplied to and derived from the structure.

21. The clock circuitry of claim 20 further including circuitry connected to be responsive to the clock waves at spatially displaced first and second nodes on the chip for (a) comparing the relative phases of the clock waves at the spatially displaced nodes, and (b) deriving a signal indicative of clock skew quality of the chip clock circuitry.

22. The clock circuitry of claim 21, wherein the signal deriving circuitry includes: (a) an additional one of said clock nodes, (b) an additional one of said coupling circuits having a clock wave input terminal connected to be responsive to a clock wave at the first node, and (c) an additional phase detector; the additional one of said clock nodes having a clock input connected to be responsive to a clock wave derived from said one additional coupling circuit of the signal deriving circuit, the phase detector arrangement being connected to be responsive to a clock wave at the second node and the clock wave output of the additional node for deriving the clock skew quality signal.

23. The clock circuitry of claim 21, wherein the signal deriving circuitry includes: (a) one of said separate circuits having a clock wave input connected to be responsive to a clock wave at a node spatially displaced farther from the one node than any other node, (b) a second of said clock nodes having a clock input connected to be responsive to a clock wave derived from said one separate circuit, and (c) a phase detector arrangement connected to be responsive to a clock wave at the first node and the clock wave output of the second node for deriving the clock skew quality signal.

24. The clock circuitry of claim 20 wherein the clock wave inputs and outputs of the nodes are connected so there is no direct feedback from the clock wave outputs and inputs of any of the different clock nodes.

25. The clock circuitry of claim 20 wherein said clock coupling circuits have a structure including a feedback arrangement, each of the feedback arrangements being arranged for controlling the relative phases of clock waves supplied to and derived from the structure.

26. Clock circuitry for supplying clock waves to many loads on an integrated circuit chip, the clock circuitry being on the chip and adapted to be responsive to a source of clock waves, the clock circuitry comprising several clock nodes at different locations on the chip, each clock node including (a) a clock wave input, (b) a clock wave output and (c) an arrangement for maintaining a predetermined phase relation between clock waves at the clock wave input and clock wave output;

clock coupling circuitry connected between the clock wave output and input of adjacent clock nodes, the clock coupling circuitry being arranged for maintaining a predetermined phase relation between the clock waves at the outputs and inputs of the adjacent clock nodes, and circuitry connected to be responsive to the clock waves at spatially displaced clock nodes on the chip for (a) comparing the relative phases of the clock waves at the spatially displaced nodes, and (b) deriving a signal indicative of clock skew quality of the chip clock circuitry.

27. The clock circuitry of claim 26, further including circuitry connected to be responsive to the clock waves at spatially displaced first and second clock nodes on the chip for (a) comparing the relative phases of the clock waves at the spatially displaced clock nodes, and (b) deriving a signal indicative of clock skew quality of the chip clock circuitry.

28. The clock circuitry of claim 27, wherein the signal deriving circuitry includes: (a) an additional one of said clock nodes, (b) an additional one of said coupling circuits having a clock wave input terminal connected to be responsive to a clock wave at the first clock node, and (c) an additional phase detector; the additional one of said clock nodes having a clock input connected to be responsive to a clock wave derived from said one additional coupling circuit of the signal deriving circuit, the phase detector arrangement being connected to be responsive to a clock wave at the second clock node and the clock wave output of the additional clock node for deriving the clock skew quality signal.

29. Clock circuitry for supplying clock waves to many loads on an integrated circuit chip, the clock circuitry being on the chip and adapted to be responsive to a source of clock waves, the clock circuitry being arranged for coupling clock waves to different regions of the chip, the clock circuitry including a first terminal for connection to be responsive to a first clock wave, a second terminal for deriving an output clock wave, and a third terminal for deriving an intermediate clock wave, the first and second terminals being in relatively close spatial proximity to each other and the third terminal being spatially far from the first and second terminals, a first path for the clock wave between the first and third terminals, a second path for the clock wave between the second and third terminals, a circuit for deriving a signal indicative of the delay time between the clock waves at the first and second terminals, each of the paths including a signal controlled delay element for the clock waves propagating in the particular path, the lengths of the routes and the delay elements being connected to be responsive to the signal so there is a predetermined delay time between the clock waves at the first and second terminals.

30. The clock circuitry of claim 29 wherein the predetermined delay time between the clock waves at the first and second terminals is such that clock wave transitions at the first and second terminals that go in the same direction are adapted to occur substantially simultaneously.

31. The clock circuitry of claim 30 wherein the first path is arranged to introduce a clock wave delay time corresponding substantially with an integral multiple of one-half cycle of a predetermined clock wave frequency and the second path is arranged to introduce a clock wave delay time corresponding substantially with an integral multiple of one-half cycle of the predetermined clock wave frequency.

32. The clock circuitry of claim 31 wherein the first path includes N segments, each segment extending between different spatial regions on the chip and including (a) one of the signal controlled delay elements and (b) a clock wave delay time causing the clock wave propagating in the segment to be delayed by $$\frac{MP}{2N}$$

where P is the duration of one cycle of the clock wave and M is an integer.

33. The clock circuitry of claim 32 where N is greater than one, the first and second paths together extending completely around the chip, each of the segments including at least one clock output terminal.

34. The clock circuitry of claim 31 wherein the chip includes several arrangements of the coupling circuitry, each arrangement of the coupling circuitry occupying a different portion of the chip.

35. The clock circuitry of claim 34 wherein at least one of the clock coupling circuitry arrangements driven by a clock wave at a terminal in close proximity to a region on the chip where the clock wave source is connected to clock circuits on the chip, and at least another of the clock circuitry arrangements driven by a clock wave at a terminal remote from the region on the chip where the clock wave source is connected to clock circuits on the chip, the at least another of the clock arrangements having no clock feedback circuitry to the clock wave driving the terminal in close proximity to the region on the chip where the clock wave source is connected to clock circuits on the chip.

36. The clock circuitry of claim 35 wherein each of the clock coupling circuitry arrangements includes first and second spaced clock nodes respectively connected to the first and third terminals so the first node is arranged to supply a clock wave to the first terminal and the third terminal is arranged to supply a clock wave to the second node, each clock node including (a) a clock wave input, (b) a clock wave output and (c) feedback circuitry for maintaining a predetermined phase relation between clock waves at the clock wave input and clock wave output of the particular node; the clock wave input of one of the nodes being adapted to be connected to the clock wave of the clock wave source.

37. The clock circuitry of claim 34 wherein each of the clock coupling circuitry arrangements has a clock wave propagation time via the first path from the first terminal to the third terminal that is substantially equal to the clock wave propagation time via the second path from the third terminal to the second terminal.

38. The clock circuitry of claim 29 further including first and second clock nodes respectively connected to the first and third terminals and respectively in close proximity to the first and third terminals, and each clock node including (a) a clock wave input, (b) a clock wave output and (c) feedback circuitry for maintaining a predetermined phase relation between clock waves at the clock wave input and clock wave output of the particular node.

39. The clock circuitry of claim 38 wherein the clock wave propagation time via the first path from the first terminal to the third terminal is substantially equal to the clock wave propagation time via the second path from the third terminal to the second terminal.

40. The clock circuitry of claim 38 wherein the first and second paths are in close proximity to each other and extend only over a limited portion of the chip, the first path including an elongated wire having a length substantially equal to the distance between the first and third terminals, and the second path including an elongated wire having a length substantially equal to the distance between the second and third terminals, the clock wave output of each of the nodes having an open loop connection except for the feedback circuitry in the node and feedback circuitry associated with the delay elements of the first and second paths.

41. The clock circuitry of claim 29 wherein the first and second paths are in close proximity to each other and extend only over a limited portion of the chip, the first path including an elongated wire having a length substantially equal to the distance between the first and third terminals, and the second path including an elongated wire having a length substantially equal to the distance between the second and third terminals, the physical properties and positions of the elongated wires being such that the elongated wires have the same electric properties for the clock waves propagating therein.

* * * * *